(12) United States Patent
Fukui

(10) Patent No.: US 8,436,945 B2
(45) Date of Patent: May 7, 2013

(54) DIGITAL BROADCAST RECEPTION APPARATUS

(75) Inventor: Masanao Fukui, Osaka (JP)

(73) Assignee: Funai Electric Co., Ltd., Osaka (JP)

(*) Notice: Subject to any disclaimer, the term of this patent is extended or adjusted under 35 U.S.C. 154(b) by 1225 days.

(21) Appl. No.: 12/010,076

(22) Filed: Jan. 18, 2008

(65) Prior Publication Data

US 2008/0178250 A1 Jul. 24, 2008

(30) Foreign Application Priority Data

Jan. 22, 2007 (JP) ................................. 2007-011177

(51) Int. Cl.
*H04N 5/50* (2006.01)

(52) U.S. Cl.
USPC .......................... 348/731; 348/705; 725/131

(58) Field of Classification Search .................. 348/705, 348/706, 730, 731; 345/525–528, 707; 725/100, 725/131, 132, 134, 139, 141, 142, 151, 152
See application file for complete search history.

(56) References Cited

U.S. PATENT DOCUMENTS

| | | | |
|---|---|---|---|
| 6,118,499 A * | 9/2000 | Fang | 348/726 |
| 6,400,421 B1 * | 6/2002 | Sakakibara | 348/732 |
| 6,628,343 B1 * | 9/2003 | Yamaguchi et al. | 348/731 |
| 7,042,526 B1 * | 5/2006 | Borseth | 348/731 |
| 7,050,119 B2 * | 5/2006 | Masuda | 348/731 |
| 7,420,627 B2 * | 9/2008 | Takagi et al. | 348/725 |
| 7,545,445 B2 * | 6/2009 | Agusa et al. | 348/732 |
| 7,679,687 B2 * | 3/2010 | Kaneko | 348/725 |
| 7,818,635 B2 * | 10/2010 | Tsukio et al. | 714/708 |
| 7,929,062 B2 * | 4/2011 | Oh | 348/732 |

FOREIGN PATENT DOCUMENTS

JP 2006-50585 2/2006

\* cited by examiner

*Primary Examiner* — Annan Shang

(74) *Attorney, Agent, or Firm* — Morgan, Lewis & Bockius LLP

(57) ABSTRACT

In a digital broadcast reception apparatus, a presetting operation is carried out and, when the presetting operation is carried out, a normal reception of a broadcast signal on a channel, which can be received in an area in which the apparatus is installed, and the normal reception of which cannot be found in the event that a gain in a gain switching amplifier is of an initial value, is made possible by a switching and setting of a gain in each VGA 3, 5a and 5b being carried out by means of a control circuit 9 or an operating unit 11.

7 Claims, 4 Drawing Sheets

DIGITAL BROADCAST RECEPTION APPARATUS

This application is based on Japanese Patent Application No. 2007-011177 filed on Jan. 22, 2007, the contents of which are hereby incorporated by reference.

BACKGROUND OF THE INVENTION

1. Field of the Invention

The present invention relates to a digital broadcast reception apparatus which receives a digital broadcast, and particularly to a digital broadcast reception apparatus which can carry out a channel selection and setting for each area.

2. Description of the Related Art

In recent years, along with the development of broadcast communication technology and code compression technology, each kind of broadcast has also become increasingly digitalized, and a broadcasting technology has shifted from analog broadcasting to digital broadcasting. In accordance with digitalization in a broadcast sector, in a broadcast reception apparatus which receives a broadcast too, a specification thereof has been changed to a specification for receiving the digital broadcasting, and a digital broadcast reception apparatus is presently being provided which meets a standard by which the digital broadcast is transmitted in a relevant country or area.

In this kind of digital broadcast reception apparatus, in the event that received power of a received broadcast signal is of an appropriate value or smaller, the received broadcast signal is amplified into a signal with a favorable S/N ratio. As opposed to this, in the event that the received power of the received broadcast signal is large beyond a tolerance level, as the received broadcast signal cannot be demodulated due to a distortion occurring therein, the received broadcast signal is attenuated into a condition in which it is receivable. As the received power of the broadcast signal varies depending on a channel frequency or a reception environment of the broadcast signal, it is necessary to set an amount of amplification or attenuation in accordance with the received power thereof.

For this reason, in the digital broadcast reception apparatus, in order to set the amount of amplification or attenuation of the broadcast signal so as to make the received power of the broadcast signal in an antenna most appropriate, a VGA (Variable Gain Amplifier) is provided which carries out an AGC (Automatic Gain Control) over a radio frequency signal received in the antenna. Furthermore, as a digital broadcast reception apparatus which adjusts the amount of amplification or attenuation of the broadcast signal by means of the VGA, one is provided which perceives a reception condition, using a demodulated signal, and sets a gain amount in the VGA, based on the reception condition (refer to JP-A-2006-50585).

Also, as described in JP-A-2006-50585 too, some digital broadcast reception apparatus include an automatic presetting function which searches for and sets a channel which can be received in an installation area. When the receivable channel is searched for using the automatic presetting function, received frequencies are switched in order and, when a tunable received frequency is found, the received frequency found is set and stored. By this means, it is possible to automatically set the channel which can be received in the area in which the digital broadcast reception apparatus is installed.

Meanwhile, the received power of the broadcast signal varies depending on the channel frequency or reception environment of the broadcast signal and, in the analog broadcasting, even in the event that the received power thereof is large, it is possible to carry out a demodulation and decoding of the broadcast signal but, in the digital broadcasting, in the event that the received power is large beyond the tolerance level, it is not possible to carry out the demodulation or the decoding. That is, as a modulation method used in the digital broadcasting, a digital modulation method is used, such as a PSK (Phase Shift Keying), an 8-VSB (Vestigial Side Band) or a QAM (Quadrature Amplitude Modulation), but, an error occurs when the demodulation is carried out by means of the demodulation method, causing a reception abnormality. For this reason, in the digital broadcast reception apparatus, it is necessary, by attenuating the gain of the broadcast signal input through the antenna, as described heretofore, to place the broadcast signal in a condition in which the demodulation and decoding thereof are possible.

However, in a case in which a channel setting using the automatic presetting function is carried out, it is often carried out without varying the gain of the received broadcast signal. For this reason, regarding a digital broadcast on a channel on which the received power of the received broadcast signal is large, a normal reception cannot be found due to an error occurring at a time of the demodulation, and the channel setting becomes impossible. In particular, as a digital broadcast signal with a lower channel frequency has larger received power when it is input through the antenna, there is a case in which the channel setting cannot be carried out on a channel using an area in which a frequency in a VHF band is low.

Also, in the digital broadcast reception apparatus of JP-A-2006-50585, an arrangement is such that, by finding a signal error after the demodulation and decoding, the reception condition is recognized, and the gain of the broadcast signal input through the antenna is changed. However, in the event that a digital broadcast on a channel, on which the received power of the broadcast signal is large beyond the tolerance level, has been received, it is impossible to demodulate and decode the received broadcast signal. For this reason, in the digital broadcast reception apparatus of JP-A-2006-50585 too, when the channel setting using the automatic presetting function is carried out, there is a case in which it is impossible to find the digital broadcast on the channel with the large received power, and carry out the channel setting.

SUMMARY OF THE INVENTION

The invention has an object of providing a digital broadcast reception apparatus which, when a channel setting is carried out, can also reliably find a digital broadcast on a channel which has been impossible to find due to a size of received power.

In order to achieve the object, a digital broadcast reception apparatus according to an aspect of the invention includes: an antenna through which is received a broadcast signal of a digital broadcast; a gain switching amplifier which, as well as attenuating or amplifying the broadcast signal received through the antenna, can switch a gain; a demodulator circuit which demodulates the broadcast signal, attenuated or amplified by the gain switching amplifier, by means of a digital modulation method; a control circuit which sets the gain in the gain switching amplifier; a memory which stores a receivable channel frequency of the broadcast signal; and an operating unit with which is set the gain in the gain switching amplifier. The memory stores: first image information which is a menu screen on which is selected a presetting operation which searches for the receivable channel frequency, and a gain switching operation which switches the gain in the gain switching amplifier by means of the operating unit; and second image information which is a gain setting menu screen on which is determined the gain in the gain switching amplifier. In the event that an instruction to carry out the presetting operation is issued when the first image information is being displayed, after the receivable channel frequency is found, the receivable channel frequency found is stored in the memory. In the event that an instruction to carry out the gain switching operation is issued when the first image information is being displayed, the second image information is displayed. In the event that an instruction to set the gain in the gain switching amplifier is issued by means of the operating unit when the second image information is being displayed, the gain in the gain switching amplifier is set based on the instruction, and the presetting operation is carried out under the set condition.

In the digital broadcast reception apparatus, when the manual presetting operation is carried out, in the event that a broadcast signal in a channel frequency designated in order to carry out a presetting cannot be received normally, it is possible to switch the gain in the gain switching amplifier by means of the operating unit and, by the switching of the gain in the gain switching amplifier, it becomes possible to receive the broadcast signal normally in the channel frequency designated in order to carry out the presetting. Also, when the automatic presetting operation is carried out, in the event that there is a channel, among receivable channels, which cannot be received normally, it being possible to switch the gain in the gain switching amplifier by means of the operating unit, it becomes possible to normally receive a broadcast signal on the channel, among the receivable channels, which cannot be received normally.

A digital broadcast reception apparatus according to another aspect of the invention includes: an antenna through which is received a broadcast signal of a digital broadcast; a gain switching amplifier which, as well as attenuating or amplifying the broadcast signal received through the antenna, can switch a gain; a demodulator circuit which demodulates the broadcast signal, attenuated or amplified by the gain switching amplifier, by means of a digital modulation method; a control circuit which sets the gain in the gain switching amplifier; a memory which stores a receivable channel frequency of the broadcast signal; and an operating unit with which is set the gain in the gain switching amplifier. When a presetting operation which searches for the receivable channel frequency is carried out, a normal reception of a broadcast signal on a channel, which can be received in an area in which the apparatus is installed, and the normal reception of which cannot be found in the event that the gain in the gain switching amplifier is of an initial value, is made possible by the switching and setting of the gain in the gain switching amplifier being carried out by means of the control circuit or the operating unit.

In this kind of broadcast reception apparatus, it is also acceptable that as the presetting operation, an automatic presetting operation is possible which automatically switches the channel frequency, and that a normal reception of a broadcast signal on a channel, which can be received in the apparatus installation area, and the normal reception of which cannot be found by means of the automatic presetting operation under a condition that the gain in the gain switching amplifier has been set at the initial value, is made possible by the switching and setting of the gain in the gain switching amplifier being carried out by means of the control circuit or the operating unit after the automatic presetting operation, under the condition that the gain in the gain switching amplifier has been set at the initial value.

Also, in this kind of broadcast reception apparatus, it is also acceptable that as the presetting operation, an automatic presetting operation is possible which automatically switches the channel frequency, and that the normal reception of the broadcast signal on the channel, which can be received in the apparatus installation area, and the normal reception of which cannot be found by means of the automatic presetting operation under the condition that the gain in the gain switching amplifier has been set at the initial value, is made possible by the automatic presetting operation being carried out again under a condition that the switching and setting of the gain in the gain switching amplifier has been carried out by the control circuit after the automatic presetting operation, under the condition that the gain in the gain switching amplifier has been set at the initial value.

Furthermore, it is also acceptable that the memory stores: first image information which is a menu screen on which is selected a presetting operation which searches for the receivable channel frequency, and a gain switching operation which switches the gain in the gain switching amplifier by means of the operating unit; and second image information which is a gain setting menu screen on which is determined the gain in the gain switching amplifier.

According to the aspects of the invention, the normal reception of the broadcast signal on the channel, which can be received in the apparatus installation area, and the normal reception of which cannot be found in the event that the gain in the gain switching amplifier is of the initial value, is made possible by the switching and setting of the gain in the gain switching amplifier being carried out by means of the control circuit or the operating unit.

DESCRIPTION OF THE PREFERRED EMBODIMENTS

Figure 1:
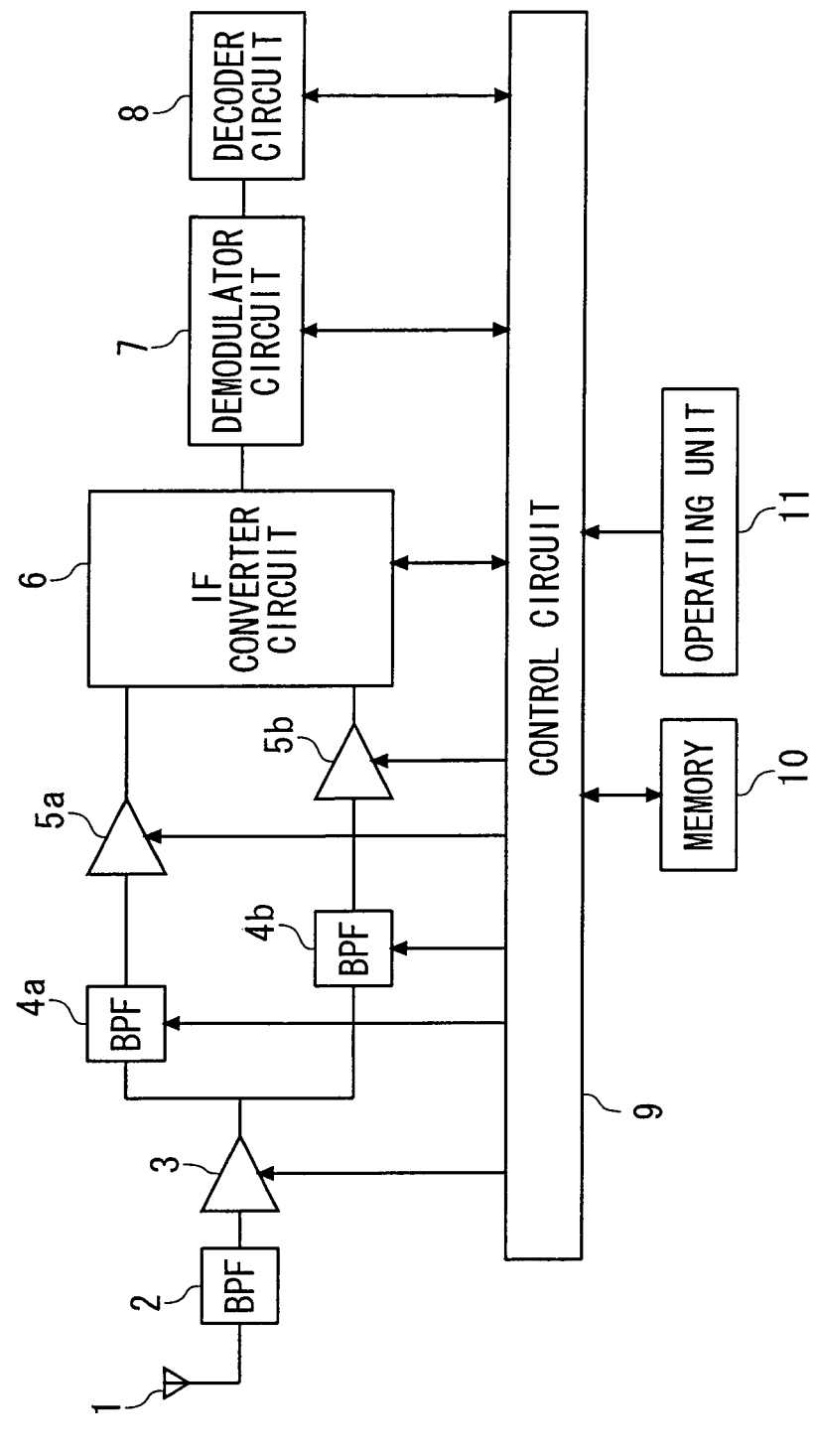
FIG. 1 is a block diagram showing an internal configuration of a digital broadcast reception apparatus of an embodiment of the invention.

A description will be given of an embodiment of the invention, referring to the drawings. In the embodiment, a description will be given, as an example, of a digital broadcast reception apparatus which receives a broadcast signal which, as well as being transmitted in each of a UHF band and a VHF band, is digitally modulated, but it is also acceptable that it receives a broadcast signal using a band other than the UHF band and the VHF band, or only one of the UHF band and the VHF band.

Configuration of Digital Broadcast Reception Apparatus

FIG. 1 is a block diagram showing an internal configuration of the digital broadcast reception apparatus of the embodiment. The digital broadcast reception apparatus shown in FIG. 1 includes an antenna 1 through which are received radio frequency (RF) signals which are digital broadcast signals, a band-pass filter (BPF) 2 which extracts a signal in a service band of a digital broadcast from the RF signals received through the antenna 1, a VGA 3 which amplifies or attenuates the RF signals passing through the BPF 2, a UHF BPF 4a which extracts a broadcast signal in the UHF band from the RF signals transmitted from the VGA 3, a VHF BPF 4b which extracts a broadcast signal in the VHF band from the RF signals transmitted from the VGA 3, VGA's 5*a* and 5*b* which amplify or attenuate the broadcast signals obtained by the BPF's 4*a* and 4*b* respectively, an IF converter circuit 6 which converts the broadcast signals transmitted from the VGA's 5*a* and 5*b* into intermediate frequency (IF) signals, a demodulator circuit 7 which, based on a digital modulation method, such as a QPSK, an 8-VSB or a QAM, demodulates the IF signals obtained by the IF converter circuit 6, a decoder circuit 8 which, based on an encoding method of the MPEG or the like, decodes the digital signals demodulated by the demodulator circuit 7, and acquires an image signal and a sound signal, a control circuit 9 which confirms received power of the broadcast signals transmitted from the VGA's 5*a* and 5*b* and, as well as changing a gain in each VGA 3, 5*a* and 5*b*, controls each block, a memory 10 in which are stored channel frequencies of channels, various conditions to set the gains or the like of the VGA's 3, 5*a* and 5*b*, operating programs, and the like, and an operating unit 11 which is operated by a user to input instructions for operations.

In the digital broadcast reception apparatus configured in this way, when the operating unit 11 is operated to request a reception of a digital broadcast on a desired channel, in the event that a reception channel is found by the control circuit 9, it is determined, based on contents stored in the memory 10, which of the UHF band and the VHF band the reception channel is in. That is, in the event that it is in the UHF band, the BPF 4*a* and the VGA 5*a* are controlled in such a way as to operate, while in the event that it is in the VHF band, the BPF 4*b* and the VGA 5*b* are controlled in such a way as to operate. Also, in the event that a channel frequency on the reception channel is found, an unshown local oscillator circuit inside the IF converter circuit 6 is controlled in such a way as to transmit an oscillation signal in an oscillation frequency corresponding to the channel frequency found from the memory 10.

Furthermore, as the modulation method and the encoding method used in the demodulator circuit 7 and the decoder circuit 8 respectively, a modulation method and an encoding method corresponding to the digital broadcast on the reception channel are selected, and are set in such a way that a demodulation and a decoding are carried out by means of the selected modulation method and encoding method, respectively. Also, the gains in the VGA's 3, 5*a* and 5*b*, set for the reception channel, are found from the memory 10, and gain settings in the VGA's 3, 5*a* and 5*b* are carried out. In this way, in the event that the setting of each block by the control circuit 9 is carried out based on the reception channel indicated by means of the operating unit 11, the digital broadcast on the channel desired by the user is selected from the RF signals received through the antenna 1, and the image signal and sound signal thereof are transmitted.

Digital Broadcast Reception Operation

Hereafter, a simple description will be given of a digital broadcast reception operation in the digital broadcast reception apparatus of a configuration such as the one of FIG. 1. As described heretofore, when the setting of each block is carried out by the control circuit 9, and the reception operation starts, a signal, among the RF signals received through the antenna 1, in a frequency band including the UHF band and the VHF band, after passing through the BPF 2, is amplified or attenuated based on the gain set by the VGA 3.

On the RF signal being amplified or attenuated by the VGA 3, when a request is being made to receive a digital broadcast on a channel in the UHF band, after an RF signal in the UHF band is extracted by the BPF 4*a* set in such a way as to operate, the RF signal is amplified or attenuated based on the gain set by the VGA 5*a*. Also, when a request is being made to receive a digital broadcast on a channel in the VHF band, after an RF signal in the VHF band is extracted by the BPF 4*b* set in such a way as to be operated, the RF signal is amplified or attenuated based on the gain set by the VGA 5*b*.

Then, when the RF signal in the UHF band or the VHF band, amplified or attenuated by the VGA 5*a* or 5*b*, respectively, is given to the IF converter circuit 6, it is mixed by the local oscillator circuit (not shown) included inside the IF converter circuit 6, and converted into the IF signal. The IF converter circuit 6 generates a local oscillation signal in a frequency, in which a frequency on the reception channel is added to the intermediate frequency, from the local oscillator circuit (not shown), and mixes it with the RF signal given by one of the VGA's 5*a* and 5*b*. By this means, the IF converter circuit 6 converts the RF signal on the reception channel into the IF signal in the intermediate frequency.

When the IF signal obtained by the IF converter circuit 6 is input into the demodulator circuit 7, after the IF signal is demodulated by means of the digital modulation method set, in the decoder circuit 8, it is decoded by means of the encoding method set, and the image signal and the sound signal are transmitted to an external monitor (not shown) and a speaker (not shown). In this way, by an image and a sound being reproduced by the monitor and the speaker which are connected to the digital broadcast reception apparatus, the digital broadcast on the desired channel is viewed and listened to.

When the digital broadcast reception operation is being carried out in this way, in the control circuit 9, a bit error rate or the like of the signal demodulated or decoded in each of the demodulator circuit 7 and the decoder circuit 8 is found, and the gains in the VGA's 3, 5*a* and 5*b* are changed into optimum ones.

Presetting Operation

In this kind of digital broadcast reception apparatus, a presetting operation is carried out which searches for and sets a channel of a digital broadcast which can be received in an area in which the apparatus is installed. A description will hereafter be given of an operation in each component of the digital broadcast reception apparatus when the presetting operation is instructed by means of the operating unit 11.

In the embodiment, the gains in the VGA's 3, 5*a* and 5*b* are set at gains corresponding to gain setting values set at a plurality of stages. Hereafter, it will be taken, as one example, that they are set at seven stages of gain setting values −3, −2, −1, 0, 1, 2 and 3. Then, when the gain setting value is −3, an amount of attenuation by each of the VGA's 3 and 5*a* or the VGA's 3 and 5*b* becomes maximum while, when the gain setting value is 3, an amount of amplification by each of the VGA's 3 and 5*a* or the VGA's 3 and 5*b* becomes maximum. Also, when the gain setting value is 0, the gains in the VGA's 3 and 5*a* or the VGA's 3 and 5*b* are made 1, causing the received broadcast signal to pass through them without changing its gain.

1. Manual Presetting

Figure 2:
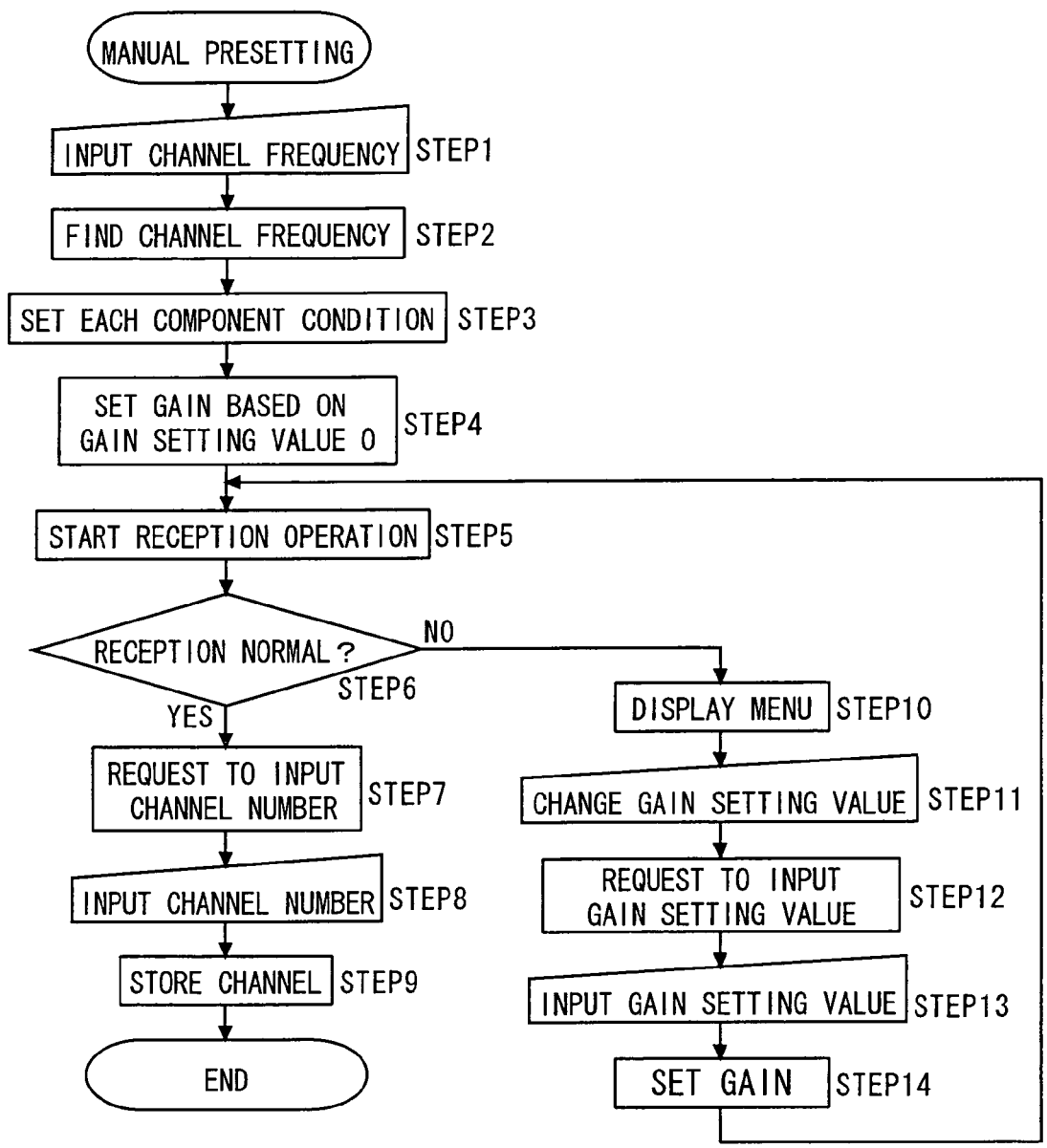
FIG. 2 is a flowchart showing a manual presetting operation in the digital broadcast reception apparatus in FIG. 1.

Firstly, a description will be given, referring to the flowchart of FIG. 2, of an operation when a manual presetting is carried out in which a channel to be preset is designated by the user. When a channel frequency of a digital broadcast to be preset is input by the operating unit 11 being operated by the user (STEP 1), the channel frequency input is found by the control circuit 9 (STEP 2).

Figure 3A:
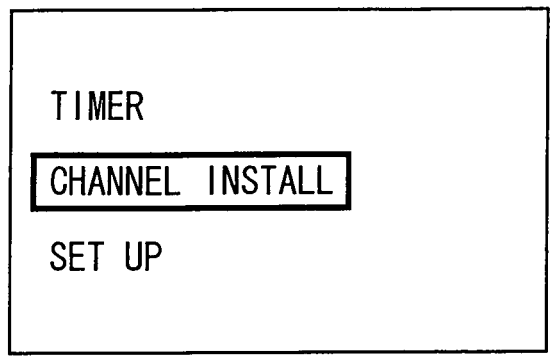
FIGS. 3A to 3C are views of an example of a menu screen display by means of an OSD image.
Figure 3B:
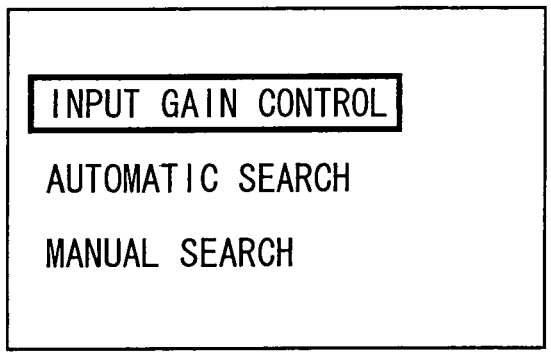

At this time, firstly, a menu screen such as the one of FIG. 3A is displayed on a display (not shown) and, by "CHANNEL INSTALL" being designated by means of an operation of the operating unit 11, firstly, a channel setting menu screen such as the one of FIG. 3B is displayed. "INPUT GAIN CON- TROL" for instructing to select and input a gain setting value, "AUTOMATIC SEARCH" for instructing to carry out an automatic presetting, and "MANUAL SEARCH" for instructing to carry out the manual presetting, are displayed on the menu screen of FIG. 3B. Then, when the instruction to carry out the manual presetting is issued by "MANUAL SEARCH" being designated by means of an operation of the operating unit 11, the user is requested to input a channel frequency, and inputs the channel frequency. The menu screens of FIGS. 3A and 3B are recorded in the memory 10 as OSD (On Screen Display) images and, by being transmitted to the display (not shown), displayed on the display.

Then, it is determined which of the UHF band and the VHF band the channel frequency input is in, and only a BPF and a VGA, among the BPF's 4a and 4b and the VGA's 5a and 5b, to be operated are turned on (STEP 3). At this time, the local oscillation frequency of the local oscillator circuit (not shown) in the IF converter circuit 6, the digital modulation method in the decoder circuit 7, the encoding method in the decoder circuit 8, and the like, are also set. Subsequently, by setting the gain setting value at 0, the gain in each of the VGA's 3 and 5a, or the gain in each of the VGA's 3 and 5b, is set (STEP 4).

In this way, when the gain in each VGA 3, 5a and 5b based on the gain setting value is set, the reception operation in the channel frequency designated starts (STEP 5). When the reception operation is started, it is determined, by the control circuit 9, whether or not the image and sound are reproduced and transmitted normally based on the error rates or the like in the demodulator circuit 7 and the decoder circuit 8 (STEP 6). It is also acceptable that the user, finding the image and sound being reproduced in and transmitted from the display and the speaker, uses the operating unit 11 to input whether or not the image and sound are being reproduced and transmitted normally, and the control circuit 9 confirms it.

If, in STEP 6, the image and sound are being reproduced and transmitted normally (Yes), a channel number for the digital broadcast in the channel frequency received is requested to be input (STEP 7). Then, when the channel number is input by means of the operating unit 11 (STEP 8), a gain setting value and a channel frequency, set for the channel number input, are recorded in the memory 10 (STEP 9).

Contrarily, if, in STEP 6, the image and sound are not being reproduced and transmitted normally (No), the menu screen of FIG. 3B is displayed on the display (not shown) in such a way that a change in the gain setting value by means of the operating unit 11 can be selected (STEP 10). Then, when an instruction to change the gain setting value is issued through the operating unit 11 (STEP 1), by displaying a gain setting menu screen of FIG. 3C on the display (not shown), an input of a gain setting value by means of the operating unit 11 is requested (STEP 12). The menu screen in FIG. 3C is also recorded in the memory 10 as the OSD image.

Figure 3C:
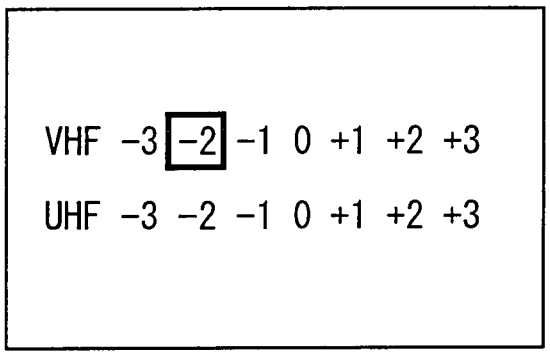

Then, when the operating unit 11 is operated, based on the menu screen of FIG. 3C, to input the gain setting value (STEP 13), the gain in each of the VGA's 3, 5a and 5b is set based on the gain setting value input (STEP 14). Subsequently, by the operation moving to STEP 5, the reception operation in the designated channel frequency is started, and it is determined whether or not the reception has been carried out normally. It is also acceptable that the operation based on the flowchart of FIG. 2 is finished when an instruction to finish each kind of setting operation, such as the presettings, the settings of the gain setting values, or the like, is issued when the menu screen of FIG. 3B is displayed in STEP 10.

2. Automatic Presetting

Next, a description will be given, referring to the flowchart of FIG. 4, of the automatic presetting in which the presetting is automatically carried out by the apparatus automatically switching the channel frequencies in order. When a starting of the automatic presetting is input by the operating unit 11 being operated by the user (STEP 101), the control circuit 9 sets the gain setting values at initial values (0 to +3) (STEP 102). At this time, firstly, a menu screen such as the one of FIG. 3A is displayed on the display (not shown) and, by "CHANNEL INSTALL" being designated by means of the operation of the operating unit 11, a channel setting menu screen such as the one of FIG. 3B is displayed. Then, by "AUTOMATIC SEARCH" being designated by means of the operation of the operating unit 11, an instruction to carry out the automatic presetting is issued.

Then, a channel frequency lowest in the service frequency band of the digital broadcast is read from the memory 10, and found by the control circuit 9 (STEP 103). Subsequently, it is determined which of the UHF band and the VHF band the channel frequency set by the control circuit 9 is in, and only a BPF and a VGA, among the BPF's 4a and 4b and the VGA's 5a and 5b, to be operated are turned on (STEP 104). At this time, the local oscillation frequency of the local oscillator circuit (not shown) in the IF converter circuit 6, the digital modulation method in the demodulator circuit 7, the encoding method in the decoder circuit 8, and the like, are also set. Also, the gain in each VGA 3 and 5a, or the gain in each VGA 3 and 5b, is set based on the gain setting values set by the control circuit 9 (STEP 105).

In this way, when the gain in each VGA 3, 5a and 5b based on the gain setting values is set, in the same way as at a time of the manual presetting operation, the reception operation is started, and it is determined whether or not a channel is receivable (STEP's 5 and 6). When, in STEP 6, it is determined that the image and sound are being reproduced and transmitted normally, and it is recognized that the channel is receivable (Yes), a channel number is set (STEP 106), and a gain setting value and a channel frequency set for the channel number are recorded in the memory 10 (STEP 9).

After the operation of storage in the memory 10 in STEP 9 is carried out, or in the event that, in STEP 6, the image and sound are not reproduced and transmitted normally, and it is not recognized that the channel is receivable (No), it is determined whether or not all the channel frequency bands allotted to the digital broadcast have been searched (STEP 107). If, in STEP 107, an unsearched band exists (No), after the control circuit 9 sets the next higher (one-channel higher) channel frequency (STEP 108), the operation moves to STEP 104 and, by operating the reception operation, it is determined whether or not it is the reception channel frequency.

In this way, receivable channel frequencies are searched for by switching the channel frequencies in order from a low frequency and, by registering the receivable channel frequencies by allotting them to channel numbers, and storing them in the memory 10, the automatic presetting is finished. Then, it is determined in STEP 107 that all the channel frequency bands have been searched (Yes) and, when the automatic setting is finished, a determination is carried out as to whether or not the setting has been carried out normally by the user for each channel number (STEP 109). If, in STEP 109, the fact that the presetting has been carried out normally is input by means of the operating unit 11 (Yes), the automatic presetting operation is finished.

Contrarily, if, in STEP 109, a channel which is not preset is found (No), it is determined whether or not the gain setting value has reached a minimum value (in the case of the embodiment, whether or not the gain setting value has reached −3) (STEP 110). If in STEP 110, the gain setting value has not reached the minimum value (No), after the gain setting value is changed to a value one stage below (STEP 111), the operation moves to STEP 103. By this means, based on the changed gain setting value, as well as the gain in each VGA 3, 5*a* and 5*b* being set, the receivable channel frequencies are searched for again by switching the channel frequencies in order from the low frequency. Also, if, in STEP 110, the gain setting value has reached the minimum value (Yes), the operation is finished.

By arranging in this way, it is possible to find the receivable channel frequencies while lowering the channel frequencies stage by stage from the actually set gain setting values 0 to +3. That is, regarding also a broadcast signal, received power of which exceeds a tolerance level when the broadcast signal is received at a gain setting value which has been selected from the gain setting values 0 to +3 and actually set, it is possible to attenuate the received power thereof and fit it within the tolerance range. By this means, a broadcast signal, which has been impossible to find, can also be found by suppressing its received power in such a way that it becomes receivable.

Also, by being kept recorded in the memory 10, the channel frequencies already recorded in the memory 10 together with the channel numbers can be placed in a condition in which they are preset, even in the event that they become unreceivable by changing the gain setting values. Also, in the event that they are receivable even when changing the gain setting values, it is also acceptable to arrange in such a way as to, for example, by comparing the error rates or the like in the demodulator circuit 7 and the decoder circuit 8, select a gain setting value with less reception errors, and record it in the memory 10.

Also, when carrying out the automatic presetting operation too, in the same way as at a time of carrying out the manual presetting operation, it is also acceptable that the display of FIG. 3C can be selected from the display of FIG. 3B in such a way that the gain setting values can be changed by means of the user's operation. That is, rather than automatically switching the gain setting value in accordance with the flowchart of FIG. 4, and searching for a channel frequency which becomes receivable at each gain setting value, it is also acceptable that the switching of the gain setting values is designated by the user.

At this time, furthermore, it is also acceptable that a digital broadcast in a channel frequency, which has been impossible to find, is found by being automatically preset again based on a gain setting value input by the user operating the operating unit 11, or it is also acceptable that the user designates a channel frequency, which has been impossible to find, by means of the manual presetting.

Figure 4:
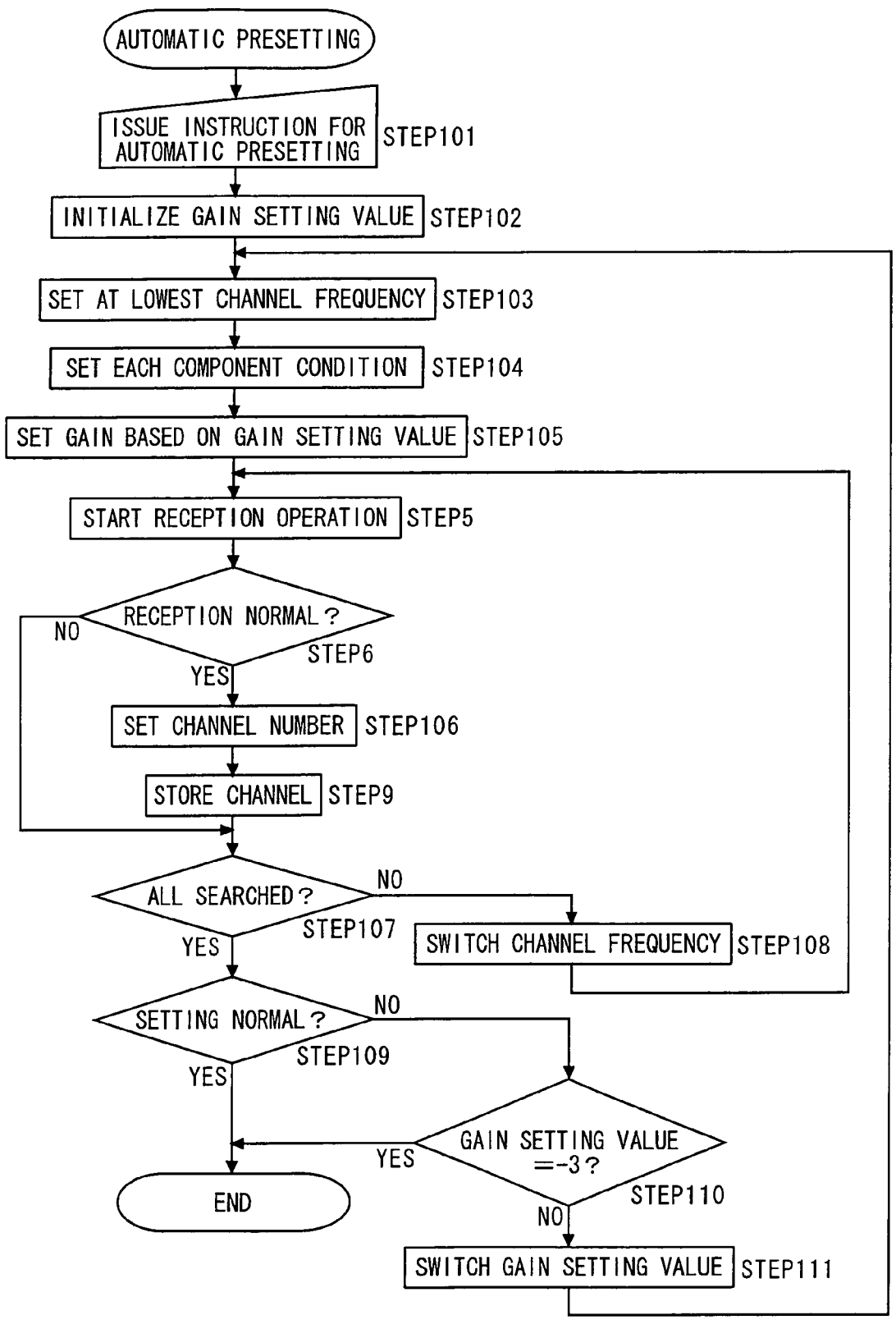
FIG. 4 is a flowchart showing an automatic presetting operation in the digital broadcast reception apparatus in FIG. 1.

Also, in the case of the automatic presetting based on the flowchart of FIG. 4, an arrangement is such that all the channel frequency bands allotted to the digital broadcast are searched every time the gain setting values are switched, but it is also acceptable that the gain setting values are switched every time the channel frequencies to be received are switched. At this time, in a case in which a search is carried out in channel frequencies which are not on the receivable channels, the search is carried out with all the gain setting values switched. Then, in the case in which the search is carried out in the channel frequencies on the receivable channels, it is also acceptable that the gain setting values are switched until the channels are received normally.

Furthermore, it is also acceptable that a receivable channel storage table, in which is recorded a channel frequency of a channel which is receivable in each installation area, is included in advance in the memory 10. At this time, it is also acceptable that, when the automatic presetting operation is carried out by inputting an installation area from the operating unit 11, the receivable channel storage table in the memory 10 is found, and a searching operation is carried out for each of the channel frequencies on the receivable channels. At this time, in the same way as in the automatic presetting operation described above, regarding a channel which has not been received normally, by automatically switching the gain setting values, the gains in the VGA's 3, 5*a* and 5*b* are set in such a way that the channel can be received normally.

In this way, according to the embodiment, it is possible to switch the gain setting value for setting the gain in each of the VGA's 3, 5*a* and 5*b* automatically or by the user designating it. With the user designating and thereby switching the gain setting value, it is possible, at a time of the presetting, to set the gain in each of the VGA's 3, 5*a* and 5*b* in such a way that a receivable channel which the user recognizes can reliably be received. Also, in the case of automatically setting it, it is possible to reliably find the receivable channel by switching the gain setting values stage by stage until the receivable channel is received normally.

The invention, being the digital broadcast reception apparatus which receives the digital broadcast, can be applied to a digital broadcast recording apparatus which records the digital broadcast in a recording medium, such as a DVD or a hard disk, a digital broadcast television which reproduces an image and a sound of the digital broadcast, or the like.

What is claimed is:

1. A digital broadcast reception apparatus comprising:
an antenna through which is received a broadcast signal of a digital broadcast;
an amplifier whose gain can be selected from a plurality of pre-determined values, and the amplifier is further configured to attenuate or amplify the broadcast signal received through the antenna at the selected gain;
a demodulator circuit which demodulates the broadcast signal, attenuated or amplified by the amplifier, by means of a digital modulation method;
a control circuit which sets the gain in the amplifier;
a memory which stores a receivable channel frequency of the broadcast signal; and
an operating unit with which the gain is set in the amplifier, wherein
the memory stores
first image information which is a menu screen on which is selected a presetting operation which searches for the receivable channel frequency, and a gain selecting operation which selects the gain in the amplifier by means of the operating unit, and
second image information which is a gain setting menu screen on which is determined the gain in the amplifier, wherein
in the event that an instruction to carry out the presetting operation is issued when the first image information is being displayed, after the receivable channel frequency is found, the receivable channel frequency found is stored in the memory, wherein
in the event that an instruction to carry out the gain selecting operation is issued when the first image information is being displayed, the second image information is displayed, and wherein
in the event that an instruction to set the gain in the amplifier is issued by means of the operating unit when the second image information is being displayed, the gain in the amplifier is set based on the instruction, and the presetting operation is carried out under the set condition.

2. A digital broadcast reception apparatus comprising:
an antenna through which is received a broadcast signal of a digital broadcast;
an amplifier whose gain can be selected from a plurality of pre-determined values, and the amplifier is further configured to attenuate or amplify the broadcast signal received through the antenna at the selected gain;
a demodulator circuit which demodulates the broadcast signal, attenuated or amplified by the amplifier, by means of a digital modulation method;
at least one of a control circuit which sets the gain in the amplifier and an operating unit with which the gain is set in the amplifier; and
a memory which stores a receivable channel frequency of the broadcast signal; and
wherein
when a presetting operation which searches for the receivable channel frequency is carried out, a normal reception of a broadcast signal on a channel, which can be received in an area in which the apparatus is installed, and the normal reception of which cannot be found in the event that the gain in the amplifier is of an initial value, is made possible by the selecting and setting of the gain in the amplifier being carried out by means of the control circuit or the operating unit.

3. The digital broadcast reception apparatus according to claim 2, wherein
as the presetting operation, an automatic presetting operation is possible which automatically switches the channel frequency,
a normal reception of a broadcast signal on a channel, which can be received in the apparatus installation area, and the normal reception of which cannot be found by means of the automatic presetting operation under a condition that the gain in the amplifier has been set at the initial value, is made possible by the selecting and setting of the gain in the amplifier being carried out by means of the control circuit or the operating unit after the automatic presetting operation, under the condition that the gain in the amplifier has been set at the initial value.

4. The digital broadcast reception apparatus according to claim 2, wherein
as the presetting operation, an automatic presetting operation is possible which automatically switches the channel frequency,
the normal reception of the broadcast signal on the channel, which can be received in the apparatus installation area, and the normal reception of which cannot be found by means of the automatic presetting operation under the condition that the gain in the amplifier has been set at the initial value, is made possible by the automatic presetting operation being carried out again under a condition that the selecting and setting of the gain in the amplifier has been carried out by the control circuit after the automatic presetting operation, under the condition that the gain in the amplifier has been set at the initial value.

5. The digital broadcast reception apparatus according to claim 2, wherein
the memory stores
first image information which is a menu screen on which is selected a presetting operation which searches for the receivable channel frequency, and a selecting operation which selects the gain in the amplifier by means of the operating unit, and
second image information which is a gain setting menu screen on which is determined the gain in the amplifier.

6. The digital broadcast reception apparatus according to claim 3, wherein
the memory stores
first image information which is a menu screen on which is selected a presetting operation which searches for the receivable channel frequency, and a selecting operation which selects the gain in the amplifier by means of the operating unit, and
second image information which is a gain setting menu screen on which is determined the gain in the amplifier.

7. The digital broadcast reception apparatus according to claim 4, wherein
the memory stores
first image information which is a menu screen on which is selected a presetting operation which searches for the receivable channel frequency, and a selecting operation which selects the gain in the amplifier by means of the operating unit, and
second image information which is a gain setting menu screen on which is determined the gain in the amplifier.

* * * * *